United States Patent
Murata

(10) Patent No.: US 7,355,876 B2
(45) Date of Patent: Apr. 8, 2008

(54) MEMORY ARRAY CIRCUIT WITH TWO-BIT MEMORY CELLS

(75) Inventor: Nobukazu Murata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/408,114

(22) Filed: Apr. 21, 2006

(65) Prior Publication Data

US 2006/0239059 A1   Oct. 26, 2006

(30) Foreign Application Priority Data

Apr. 26, 2005   (JP) .............................. 2005-127362

(51) Int. Cl.
*G11C 5/06*   (2006.01)
(52) U.S. Cl. .................... 365/63; 365/104; 365/185.03
(58) Field of Classification Search .................. 365/63, 365/185.13, 185.16, 185.17, 185.18, 103, 365/104, 94
See application file for complete search history.

(56) References Cited

U.S. PATENT DOCUMENTS 6,018,487 A * 1/2000 Lee et al. .................... 365/204
6,147,912 A  11/2000 Kitazawa
6,233,168 B1  5/2001 Kokubun et al.
6,477,089 B2 * 11/2002 Takeda et al. ......... 365/189.09
2004/0222452 A1  11/2004 Matsuoka et al.

FOREIGN PATENT DOCUMENTS

| JP | 11-203880 | 7/1999 |
| JP | 2000-57794 | 2/2000 |
| JP | 2004-335797 | 11/2004 |

\* cited by examiner

*Primary Examiner*—Gene N. Auduong
(74) *Attorney, Agent, or Firm*—Rabin & Berdo, P.C.

(57) ABSTRACT

A high-speed nonvolatile memory array has two-bit memory cells, each connected to a mutually adjacent pair of sub-bit lines. The sub-bit lines are connected to a common power supply line through switching elements controlled in a cyclic sequence by 2m signal lines, where m is an integer greater than one. The memory array circuit also has main bit lines, each connected to a group of m consecutive sub-bit lines through switching elements controlled in a cyclic sequence by m signal lines. Data are read through two mutually adjacent main bit lines from two memory cells selected so that the sub-bit lines connecting the two main bit lines to the two memory cells are located between the sub-bit lines connecting the two memory cells to the common power line, an arrangement that reduces parasitic capacitance.

14 Claims, 8 Drawing Sheets

US 7,355,876 B2

MEMORY ARRAY CIRCUIT WITH TWO-BIT MEMORY CELLS

BACKGROUND OF THE INVENTION

1. Field of the Invention

The present invention relates to a memory array circuit for a nonvolatile memory device with two-bit memory cells.

2. Description of the Related Art

Related art is disclosed in U.S. Pat. No. 6,147,912 to Kitazawa, U.S. Pat. No. 6,233,168 to Kokubun et al., and U.S. Patent Application Publication No. 2004/0222452 by Matsuoka et al. (and in the corresponding Japanese Patent Application Publications No. 11-203880, 200-57794, and 2004-335797).

A memory array circuit disclosed by Kitazawa is illustrated in FIG. 1. The memory array comprises a plurality of subblocks and a multiplexer; one subblock (SUBBLK) 1 and the corresponding part of the multiplexer (MPX) 2 are shown in FIG. 1. The subblock 1 comprises a plurality of parallel word lines WL0, WL1, . . . , a plurality of select lines SL0, SL1, . . . that cross the word lines, and a plurality of sub-bit lines SBL0, SBL1, . . . that also cross the word lines. Memory cells MC0, MC1, . . . are located at the intersections of the word lines and select lines (only the memory cells on word line WL0 are shown). Each memory cell has a floating gate that stores data as the presence or absence of charge, a control electrode connected to the adjacent word line, a drain connected to the adjacent select line, and a source connected to the adjacent sub-bit line.

The select lines SL0, SL1, . . . are connected through respective switching transistors referred to as drain selectors DS0, DS1, . . . to a common power supply line CDV. The gates of the even-numbered drain selectors DS0, DS2, . . . are all connected to a drain select line DSE; the gates of the odd-numbered drain selectors DS1, DS3, . . . are all connected to another drain select line DSO. The sub-bit lines SBL0, SBL1, . . . are connected through respective switching transistors referred to as source selectors SS0, SS1, . . . to respective main bit lines MBL0, MBL1, . . . .

Although not shown, a plurality of subblocks similar to subblock 1 are connected in parallel to the main bit lines MBL0, MBL1 . . . . The main bit lines MBL0, MBL1, . . . are connected through the multiplexer 2 to data lines DL0, DL1. The multiplexer 2 selects a mutually adjacent pair of main bit lines according to select signals Y0, Y1, . . . and connects them to the data lines DL0, DL1.

Sense amplifiers SA0, SA1 are connected to the data lines DL0, DL1. Although not shown, a data write circuit and other circuits are also connected to the data lines. The sense amplifiers SA0, SA1 detect the current flowing through a selected pair of memory cells to the ground level, thereby reading out the information stored in the memory cells.

FIG. 2 illustrates the readout operation when memory cells MC6 and MC9 in FIG. 1 are selected. The thick lines indicate the active signal lines and the paths of the currents flowing through the selected memory cells MC6, MC9.

As shown in FIG. 2, when the source select line SS and select signal Y3 are driven to the high logic level, two current paths are activated: one from sub-bit line SBL3 to sense amplifier SA0 via main bit line MBL3 and data line DL0; the other from sub-bit line SBL4 to sense amplifier SA1 via main bit line MBL4 and data line DL1. If word line WL0 and drain select line DS0 are also driven to the high logic level, another two current paths are activated, one from the common power supply line CDV to sub-bit line SBL3 via drain selector DS3 and memory cell MC6 and another to sub-bit line SBL4 via drain selector DS5 and memory cell MC9. Therefore, when memory cell MC6 stores the data '1', for example, read current flows through main bit line MBL3 to sense amplifier SA0. When memory cell MC9 stores the data '1', read current flows through main bit line MBL4 to sense amplifier SA1.

It can appreciated from FIG. 2 that when memory cells MC6 and MC9 are read, the sub-bit lines SBL3, SBL4 on the read paths may be interconnected through the on-resistances of memory cells MC7 and MC8. The voltage levels of the sub-bit lines SBL3, SBL4 are equalized by the sense amplifiers SA0, SA1 regardless of the data stored in the memory cells MC6, MC9. When the data stored in memory cells MC6 and MC9 differ, however, a voltage difference occurs between sub-bit lines SBL3 and SBL4, so leakage current flows through memory cells MC7 and MC8. Accordingly, when this memory array circuit is used, the leakage current needs to be small enough to be negligible.

The intermediate memory cells MC7, MC8 and the sub-bit lines SBL3, SBL4 used for reading data are both disposed between the memory cells MC6, MC9 being read. Therefore, aside from the unavoidable parasitic capacitance components on the read paths, such as the parasitic capacitance of sub-bit lines SBL3, SBL4 and main bit lines MBL3, MBL4, the parasitic capacitance that slows the read operation is limited mainly to select line SL4 and the memory cells MC7, MC8 connected thereto. This substantial limitation of parasitic capacitance to the circuit elements disposed between the selected memory cells dramatically reduces the total parasitic capacitance, enabling high-speed operation.

The above memory array circuit, however, is designed for use with nonvolatile memory cells storing data as the presence or absence of charge stored in a single floating gate, and having a fixed source electrode and drain electrode.

With the recent increase in demand for large memory capacity, nonvolatile memory elements that can store two bits of information in a single memory cell have emerged.

A two-bit memory cell described by Matsuoka et al. is illustrated in FIGS. 3 to 7.

As shown in the sectional view of FIG. 3, the memory cell has a gate electrode 13 insulated by a gate oxide layer 12 from the surface of a p-well region 11, and charge storage regions 14L, 14R comprising silicon nitride films formed on the sidewalls of the gate electrode 13. N-type diffusions 15L, 15R formed at the surface of the p-well region 11 extend partly below the charge storage regions 14L, 14R. N-type diffusion 15L can be used as a source electrode and 15R as a drain electrode or, reversely, n-type diffusion 15R can be used as a source electrode and 15L as a drain electrode, depending on the applied voltages.

FIG. 4 illustrates an operation that writes data into the left n-type diffusion 15L of the memory cell. The right n-type diffusion 15R is used as the source electrode and the left n-type diffusion 15L as the drain electrode. For example, the right n-type diffusion 15R and p-well region 11 are biased to zero volts (0 V), and the left n-type diffusion 15L and gate electrode 13 are biased to +5 V. An inversion layer 16 extends from the right n-type diffusion 15R, but is pinched off before reaching the left n-type diffusion 15L. Electrons are accelerated by a high electric field from the pinch-off point to the n-type diffusion 15L, becoming so-called hot electrons. The hot electrons are injected into the left charge storage region 14L and stored as data. No hot electrons are generated in the vicinity of the right charge storage region 14R, so no write operation is performed there.

To write data into the right charge storage region 14R, the left n-type diffusion 15L is used as the source electrode and the right n-type diffusion 15R as the drain electrode.

FIG. 5 illustrates a read operation. To read the information stored in the left charge storage region 14L, the memory cell transistor is operated using the left n-type diffusion 15L as the source electrode and the right n-type diffusion 15R as the drain electrode. For example, the left n-type diffusion 15L and p-well region 11 are biased to 0 V, the right n-type diffusion 15R is biased to +1.8 V, and the gate electrode 13 is biased to +2 V. If no electrons are stored in the left charge storage region 14L, an inversion layer 16 forms and drain current flows readily. In contrast, if electrons are stored in the left charge storage region 14L, hardly any inversion layer forms therebelow, so hardly any drain current flows. Accordingly, the information stored in the charge storage region 14L can be read out by detecting the drain current. To read the information stored in the right charge storage region 14R, the memory cell transistor is operated using the right n-type diffusion 15R as the source electrode and the left n-type diffusion 15L as the drain electrode.

FIG. 6 illustrates an erase operation. To erase the information stored in the left charge storage region 14L, the pn-junction between the left n-type diffusion 15L and p-well region 11 is reversely biased by positively biasing the n-type diffusion 15L (for example, to +5 V) with respect to the p-well region 11, which is biased at 0 V. In addition, the gate electrode 13 is negatively biased (for example, to −5 V) and the right n-type diffusion 15R is biased to 0 V. The potential gradient at the pn-junction thereby becomes especially steep in the vicinity of the gate electrode 13 due to the effect of the negatively biased gate electrode, which induces band-to-band tunneling and generates hot holes on the p-well side of the pn-junction. The hot holes are attracted towards the negatively biased gate electrode 13 and injected into the left charge storage region 14L, erasing the information stored therein. To erase information stored in the right charge storage region 14R, it suffices to interchange the potentials of the charge storage regions 15L, 15R.

As described above, in a two-bit memory cell, charge storage regions 14L, 14R are formed on the left and right sidewalls of the gate electrode 13, and corresponding left and right n-type diffusions 15L, 15R are used as source and drain electrodes, respectively, or as drain and source electrodes, respectively, to store two bits of information.

This type of memory cell cannot be used in the conventional memory array circuit illustrated in FIG. 7, because the select lines must always be connected to the drain electrodes and the sub-bit lines must always be connected to the source electrodes of the memory cells.

SUMMARY OF THE INVENTION

An object of the present invention is to provide a non-volatile memory array circuit, readable at high speed, in which each memory cell stores two bits of information.

The memory cells in the invented memory array circuit are disposed within a grid of mutually parallel word lines crossing 2mn+1 mutually parallel sub-bit lines, where m and n are integers greater than one. Each memory cell has a pair of main electrodes, which are connected to a mutually adjacent pair of sub-bit lines, and a control electrode connected to a word line. Each sub-bit line is connected through a switching element to a common power supply line. The memory array circuit also has 2n main bit lines, each connected through m switching elements to a different group of m consecutive sub-bit lines.

A memory cell stores two bits of information, which are readable from different main electrodes when the word line to which the control electrode is connected is activated. One bit is read if the switching elements connect the memory cell's first main electrode to the common power line and the memory cell's second main electrode to a main bit line; the other bit is read if the selectors connect the second main electrode to the common power line and the first main electrode to a main bit line.

The switching elements connecting the sub-bit lines to the main bit lines are controlled by signals on m first signal lines. Each first signal line is connected to a different set of these switching elements, placed at intervals of m sub-bit lines.

The switching elements connecting the sub-bit lines to the common power supply line are controlled by signals on 2m second signal lines. Each second signal line is connected to a different set of these switching elements, placed at intervals of 2m sub-bit lines.

The memory array circuit preferably also includes a pair of sense amplifiers and a multiplexer that connects a selectable pair of mutually adjacent main bit lines to the sense amplifiers to read data from a selectable pair of memory cells. The multiplexer operates in conjunction with the signals on the first and second signal lines so that the sub-bit lines connecting the selected memory cells to the selected main bit lines are disposed between the sub-bit lines connecting the selected memory cells to the common power supply line.

This structure enables data to be read two bits at a time from two different memory cells storing two bits each. If the multiplexer operates as described above, parasitic capacitance is reduced and the data can be read at high speed.

DETAILED DESCRIPTION OF THE INVENTION

Figure 1:
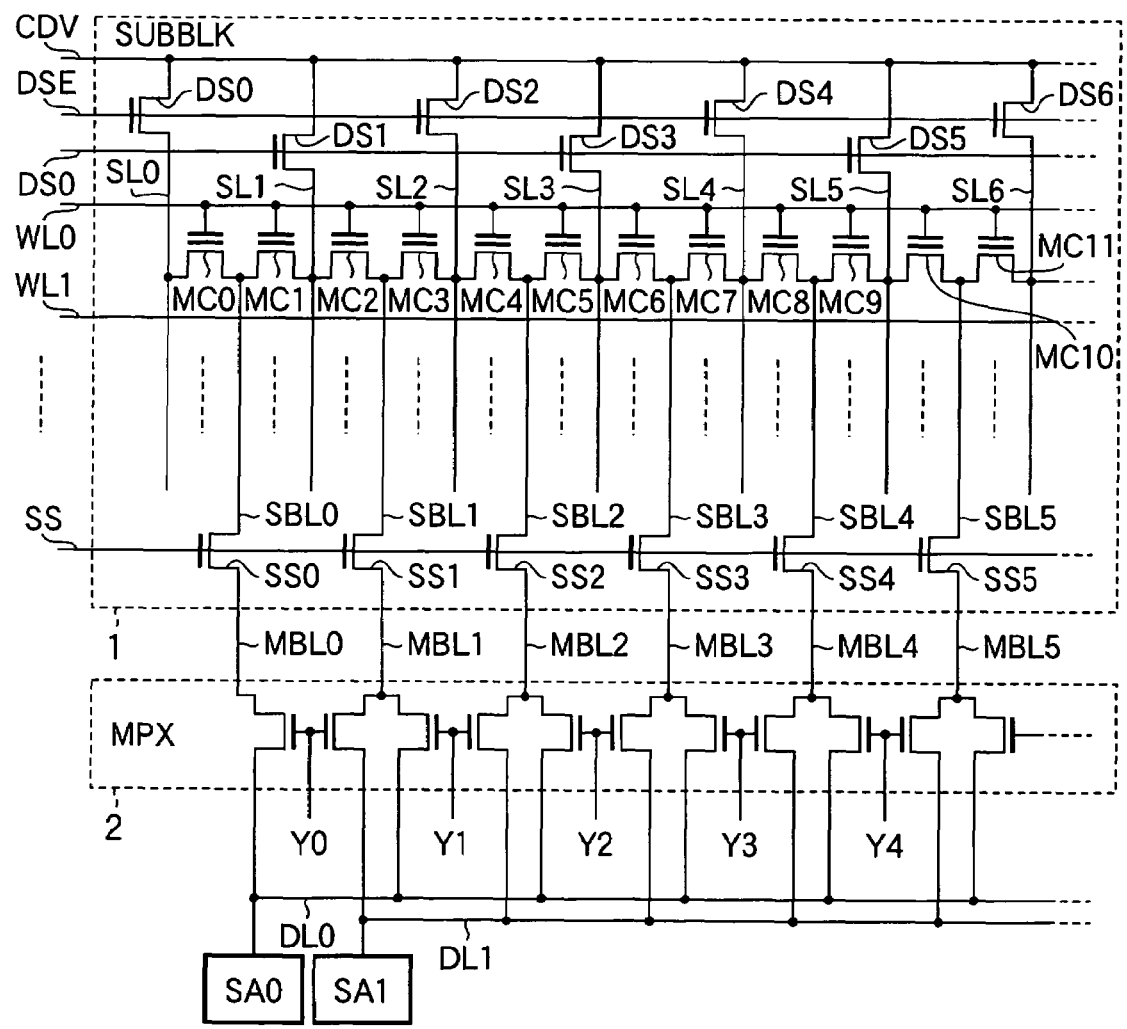
FIG. 1 shows the structure of a conventional memory array circuit.
Figure 2:
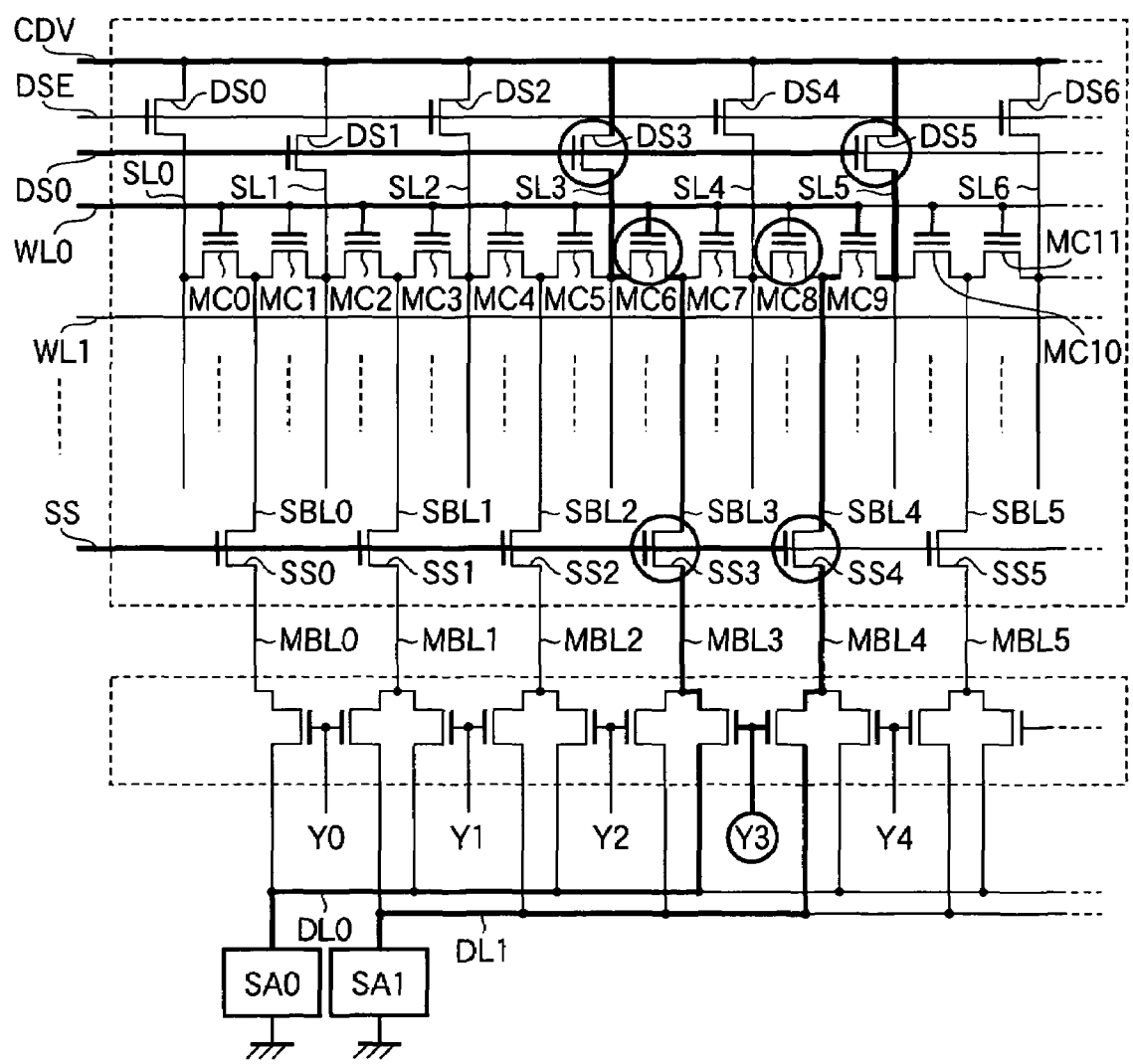
FIG. 2 indicates the active signal lines when memory cells MC6 and MC9 are selected in FIG. 1.

Embodiments of the invention will now be described with reference to the attached drawings, in which like elements are indicated by like reference characters.

Figure 3:
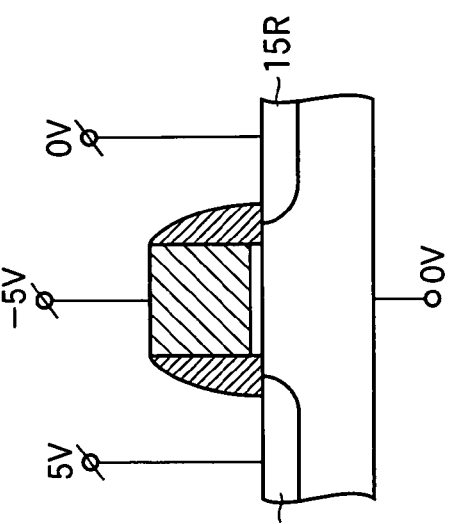
FIGS. 3, 4, 5, and 6 are sectional views of a two-bit memory cell.
Figure 4:
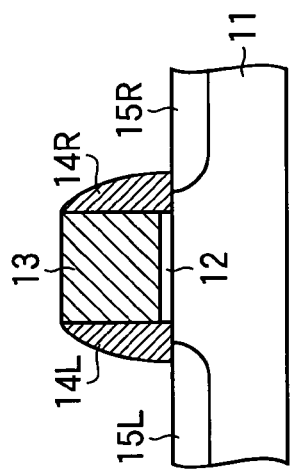
Figure 5:
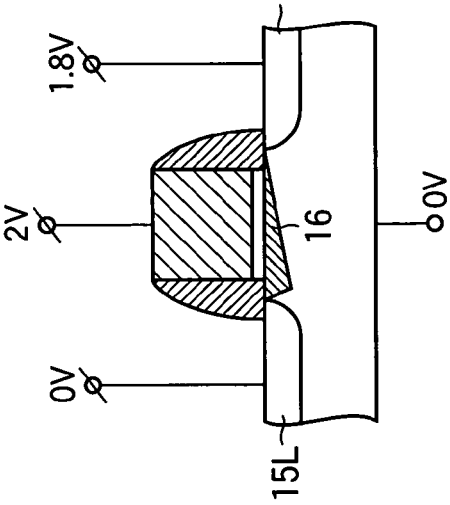
Figure 6:
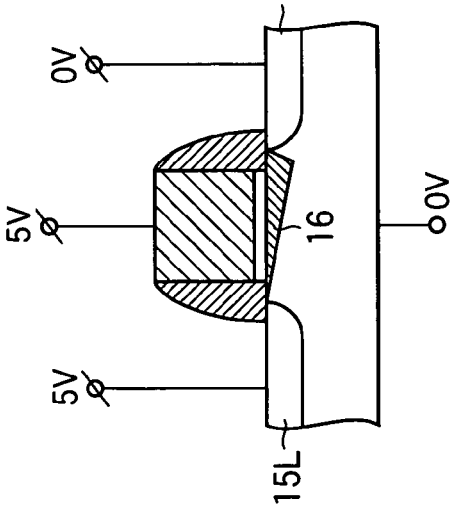

The memory cells in the embodiments have the structure shown in FIG. 3, the main electrodes being the n-type diffusions 15L, 15R or metal electrodes making electrical contact therewith, the control electrode being the gate electrode 13. The switching elements are metal-oxide-semiconductor field-effect transistors: the first switching elements will be referred to as source selectors, and the first signal lines as source select lines; the second switching elements will be referred to as drain selectors, and the second signal lines as drain select lines. Embodiments will be shown in which the parameter m is equal to two, three, and four.

First Embodiment

Figure 7:
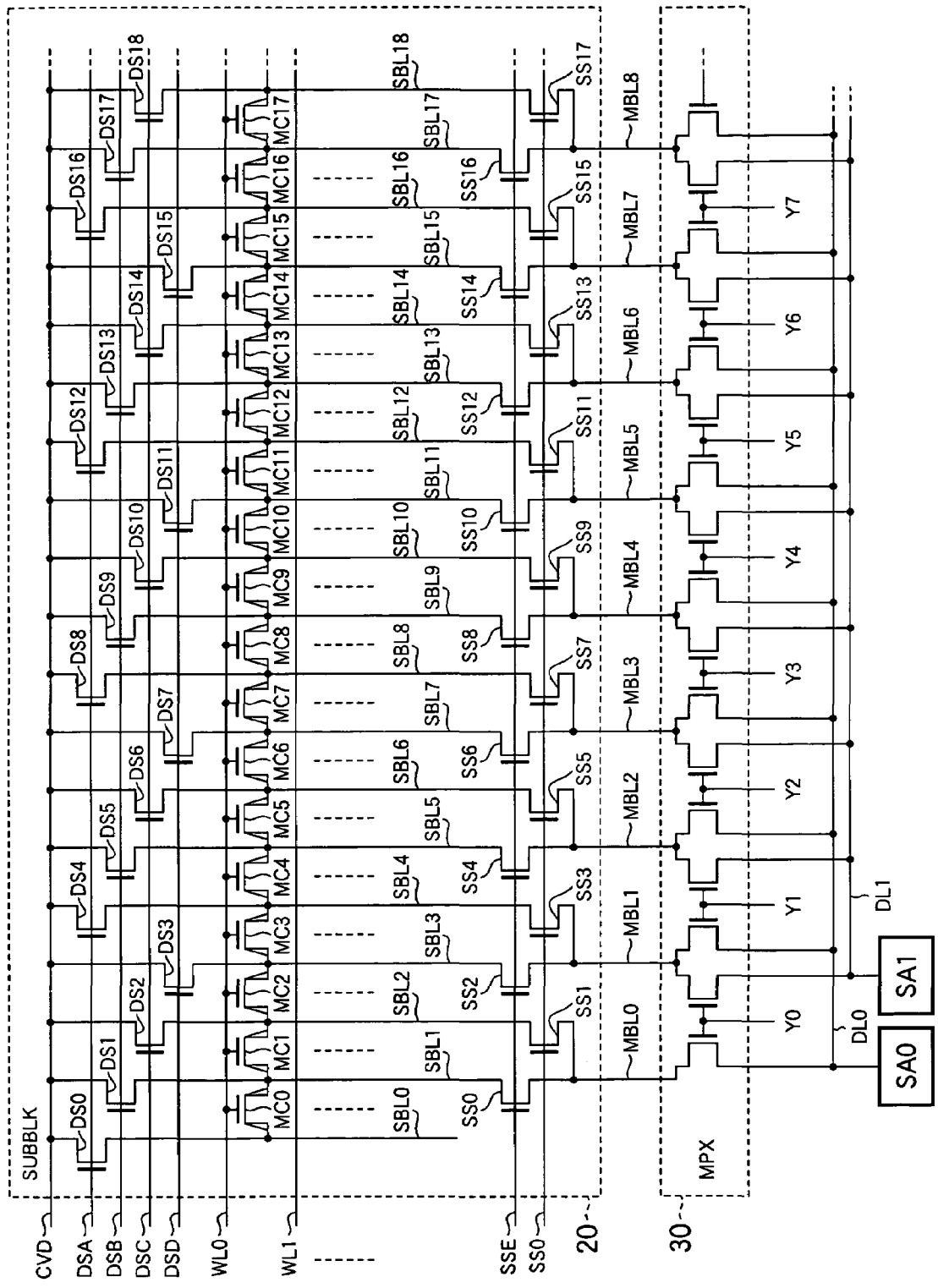
FIG. 7 shows the structure of a memory array circuit illustrating a first embodiment of the invention.

The first embodiment is a memory array circuit comprising a plurality of subblocks, one of which is partly shown in FIG. 7. The subblock 20 has a multiplexer (MPX) 30, a plurality of mutually parallel word lines WLi (i=0, 1, . . . ) and a plurality of mutually parallel sub-bit lines SBLj (j=0, 1, . . . ) that cross the word lines.

Memory cells MCj (j=0, 1, . . . ) are located at the intersections of the word lines WLi and sub-bit lines SBLj (only the memory cells on word line WL0 are shown). Each memory cell MCj is a nonvolatile two-bit memory cell structured as shown in FIG. 3, having its gate electrode 13 connected to a corresponding word line WLi, and its first and second main electrodes 15L, 15R connected to mutually adjacent sub-bit lines SBLj and SBLj+1, respectively.

The sub-bit lines SBLj are connected through switching transistors referred to as drain selectors DSj to a common power supply line CDV at the top in the drawing. Drain selectors DS(4j) (j=0, 1, 2, . . . ) have their gates connected to a first drain select line DSA. Similarly, drain selectors DS(4j+1), DS(4j+2), and DS(4j+3) have their gates connected to second, third, and fourth drain select lines DSB, DSC, and DSD, respectively.

The other ends (the lower ends in the drawing) of the sub-bit lines SBLj are connected through switching transistors referred to as source selectors SSj to corresponding main bit lines. Specifically, the mutually adjacent odd- and even-numbered sub-bit lines SBL2k+1, SBL2k+2 (for example, SBL1, SBL2) are connected through the respective source selectors SS2k, SS2k+1 (in this example, SS0, SS1) to main bit line MBLk (in this example, MBL0), where k is an arbitrary non-negative integer. The gates of the even-numbered source selectors SS2n are all connected to a first source select line SSE, and the gates of the odd-numbered source selectors SS2n+1 are all connected to a second source select line SSO. A plurality of subblocks similar to the illustrated subblock 20 are connected in parallel to the main bit lines MBL0, MBL1, . . . .

The main bit lines MBL0, MBL1, . . . are connected through the multiplexer 30 to data lines DL0, DL1. The multiplexer 30 selects a mutually adjacent pair of main bit lines according to select signals Y0, Y1, . . . and connects them to data lines DL0, DL1. Sense amplifiers SA0, SA1 are connected to the respective data lines DL0, DL1. Although not shown, a data write circuit and other circuits are also connected to the data lines. The sense amplifiers SA0, SA1 detect the current flowing through a selected memory cell to the ground level, thereby reading out the information stored in the memory cell.

Although not shown in FIG. 7, address signals are decoded by an address decoder to obtain select signals for the source select lines SSE, SSO and drain select lines DSA to DSD, drive signals for the word lines WLi, and select signals Yi for the multiplexer 30. By way of example, the upper bits of the address signals are decoded to obtain the select signals for the source select lines SSE, SSO that select the subblock 20; the lower bits of the address signals are decoded to obtain the select signals Yi in the multiplexer 30; and the remaining intermediate bits of the address signals are decoded to obtain the drive signals for the word lines WLi and select signals for the drain select lines DSA to DSD.

Figure 8:
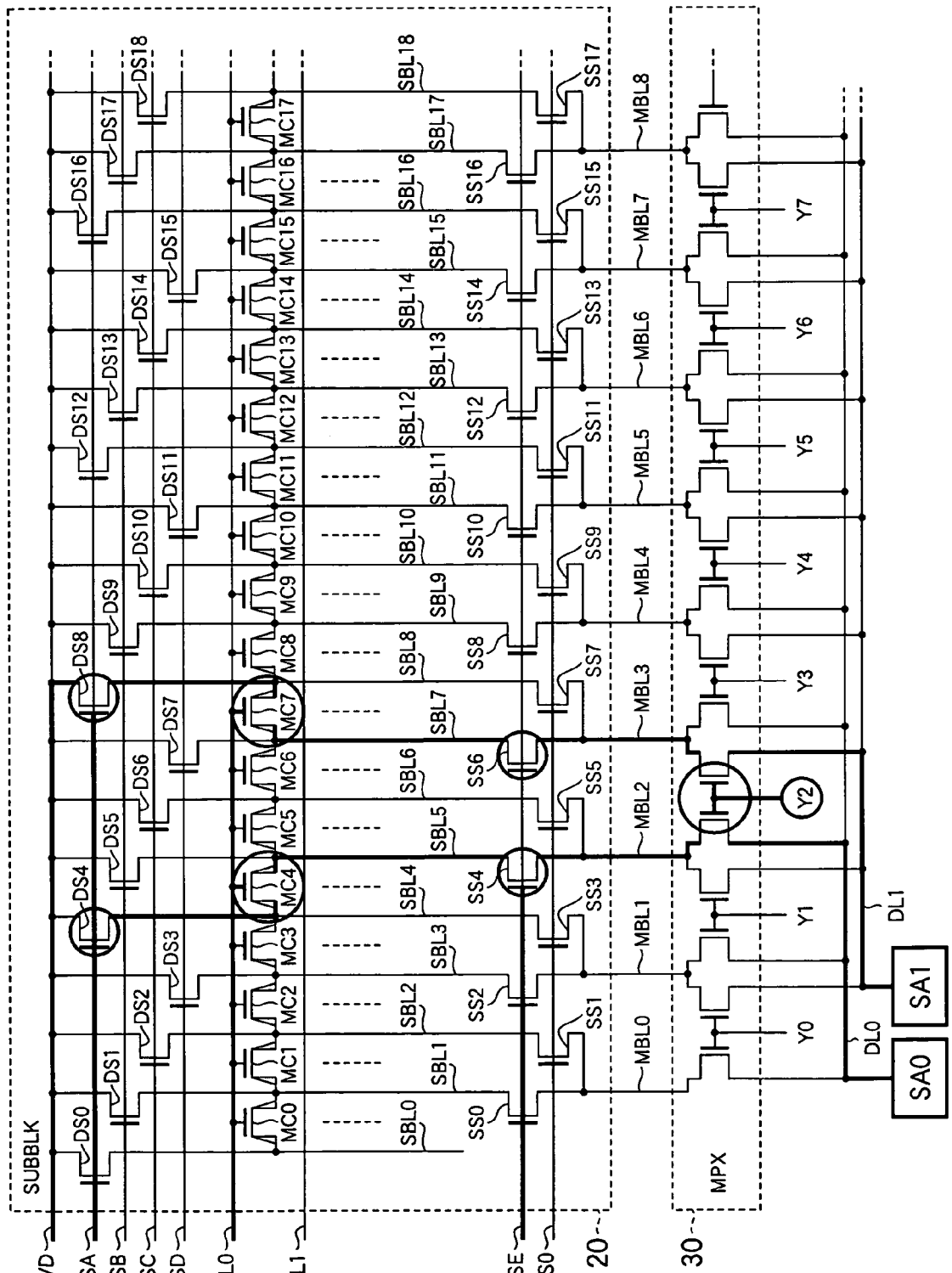
FIG. 8 indicates the active signal lines when memory cells MC4 and MC7 are selected in FIG. 7.

FIG. 8 illustrates access to memory cells MC4 and MC7 in FIG. 7. The thick lines indicate the selected drain select line DSA, word line WL0, source select line SSE, and select signal Y2 and the paths of the currents flowing through the selected memory cells MC4, MC7.

As shown in FIG. 8, when source select line SSE and select signal Y2 are driven to the high logic level, sub-bit lines SBL5 and SBL7 are connected through respective main bit lines MBL2 and MBL3 to the data lines DL0, DL1. Word line WL0 and drain select line DSA are also driven to the high logic level, creating two paths from the common power supply line CDV: one path reaches sub-bit line SBL5 via drain selector DS4, sub-bit line SBL4, and memory cell MC4; and the other path reaches sub-bit line SBL7 via drain selector DS8, sub-bit line SBL8, and memory cell MC7.

The left and right main electrodes of memory cell MC4 are thereby connected to the common power supply line CDV and data line DL0, respectively, whereas the right and left main electrodes of memory cell MC7 are connected to the common power supply line CDV and data line DL1, respectively.

Accordingly, if the common power supply line CDV and word line WL0 are biased to 5 V and the data lines DL0, DL1 are biased to 0 V, information can be written into the left charge storage region of memory cell MC4 and the right charge storage region of memory cell MC7.

If the word line WL0 and common power supply line CDV are biased to 2 V and 1.8 V, respectively, and the sense amplifiers SA0, SA1 are activated, the information stored in the right charge storage region of memory cell MC4 and left charge storage region of memory cell MC7 can be read.

The read paths in this read operation are selected so that the sub-bit lines SBL5, SBL7 that supply read current to the main bit lines are disposed between the selected memory cells MC4, MC7 and hence between the sub-bit lines SBL4, SBL8 that supply read current to the selected memory cells. Therefore, although parasitic capacitance is inevitable on the read paths, including the selected sub-bit lines SBL5, SBL7 and main bit lines MBL2, MBL3, off-path parasitic capacitance is confined mainly to one intermediate non-selected select line SL6 and two intermediate memory cells MC5, MC6 connected thereto. As in the memory array circuit shown in FIG. 1, this limiting of off-path parasitic capacitance components to circuit elements disposed between the selected memory cells dramatically reduces the total parasitic capacitance, enabling high-speed operation.

Figure 9:
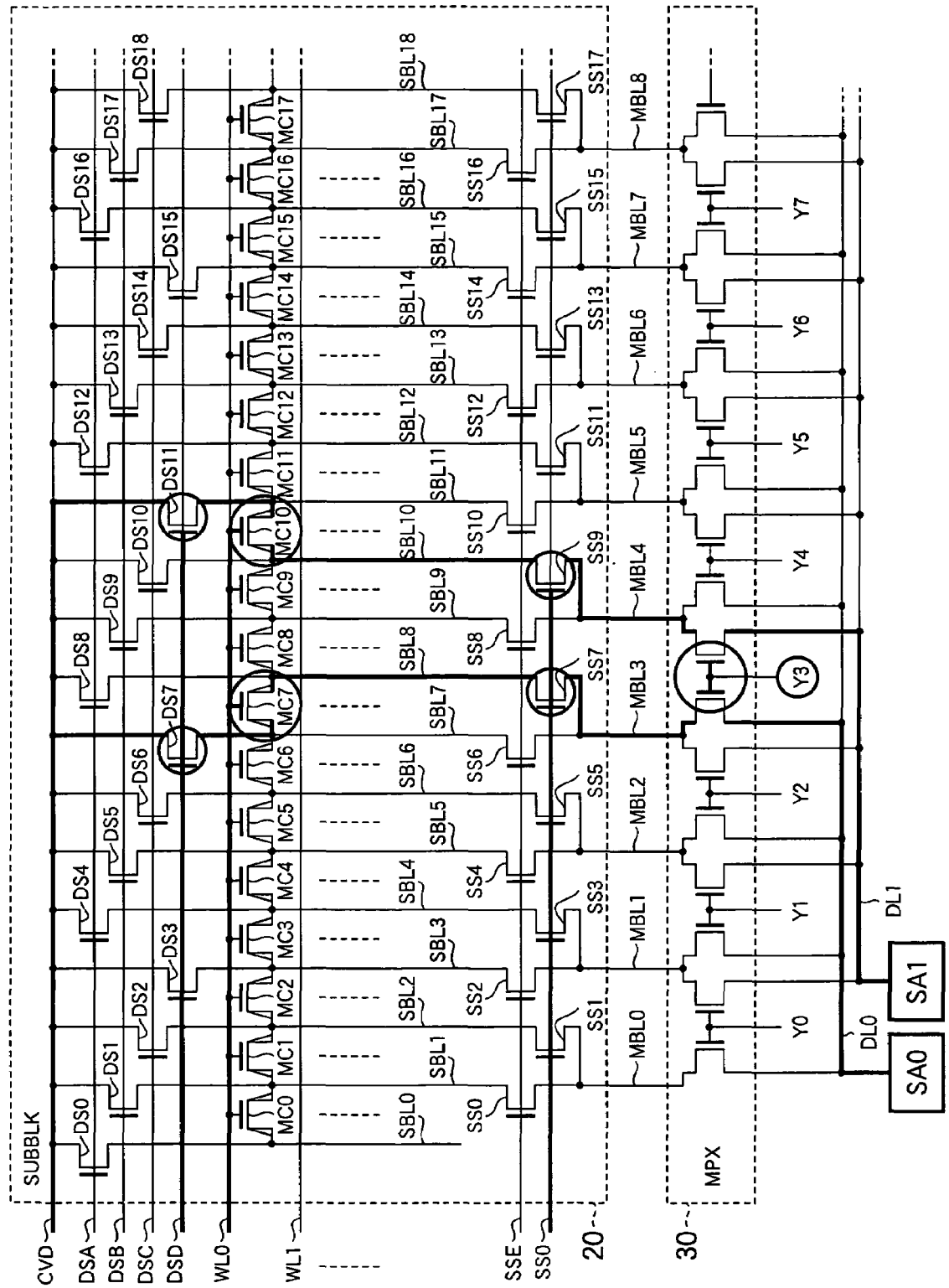
FIG. 9 indicates the active signal lines when memory cells MC7 and MC10 are selected in FIG. 7.

FIG. 9 illustrates another case, in which memory cells MC7 and MC10 in FIG. 7 are selected. The thick lines now indicate the selected drain select line DSD, word line WL0, source select line SSO, and select signal Y3 and the paths of the currents flowing through the selected memory cells MC7, MC10. The sub-bit lines SBL8, SBL10 selected for reading data are both disposed between the selected memory cells MC7 and MC10, so off-path parasitic capacitance is limited mainly to one intermediate sub-bit line SBL9 and two intermediate memory cells MC8, MC9.

It should be noticed that the direction of the current flow through memory cell MC7 in FIG. 9 is opposite to the direction of the current flow through the same memory cell MC7 in FIG. 8. The information stored in the right charge storage region of memory cell MC7 can thereby be read in FIG. 9. In a write operation, information can be written into the left charge storage region of memory cell MC7.

As described above, the memory array circuit in the first embodiment is configured with drain selectors and source selectors provided at opposite ends of the sub-bit lines SBLj so that the connections to the common power supply line CDV and the main bit lines can be changed. The first and second main electrodes of a memory cell MCj connected to mutually adjacent sub-bit lines SBLj, SBLj+1 can be used as a source electrode and a drain electrode, respectively, or as a drain electrode and a source electrode, respectively. The memory array circuit can therefore be used with nonvolatile two-bit memory cells.

The first embodiment also has an advantage in that, since the sub-bit lines used for reading data are disposed between the two selected memory cells, the parasitic capacitances on the read paths are reduced, enabling high-speed operation.

Second Embodiment

Figure 10:
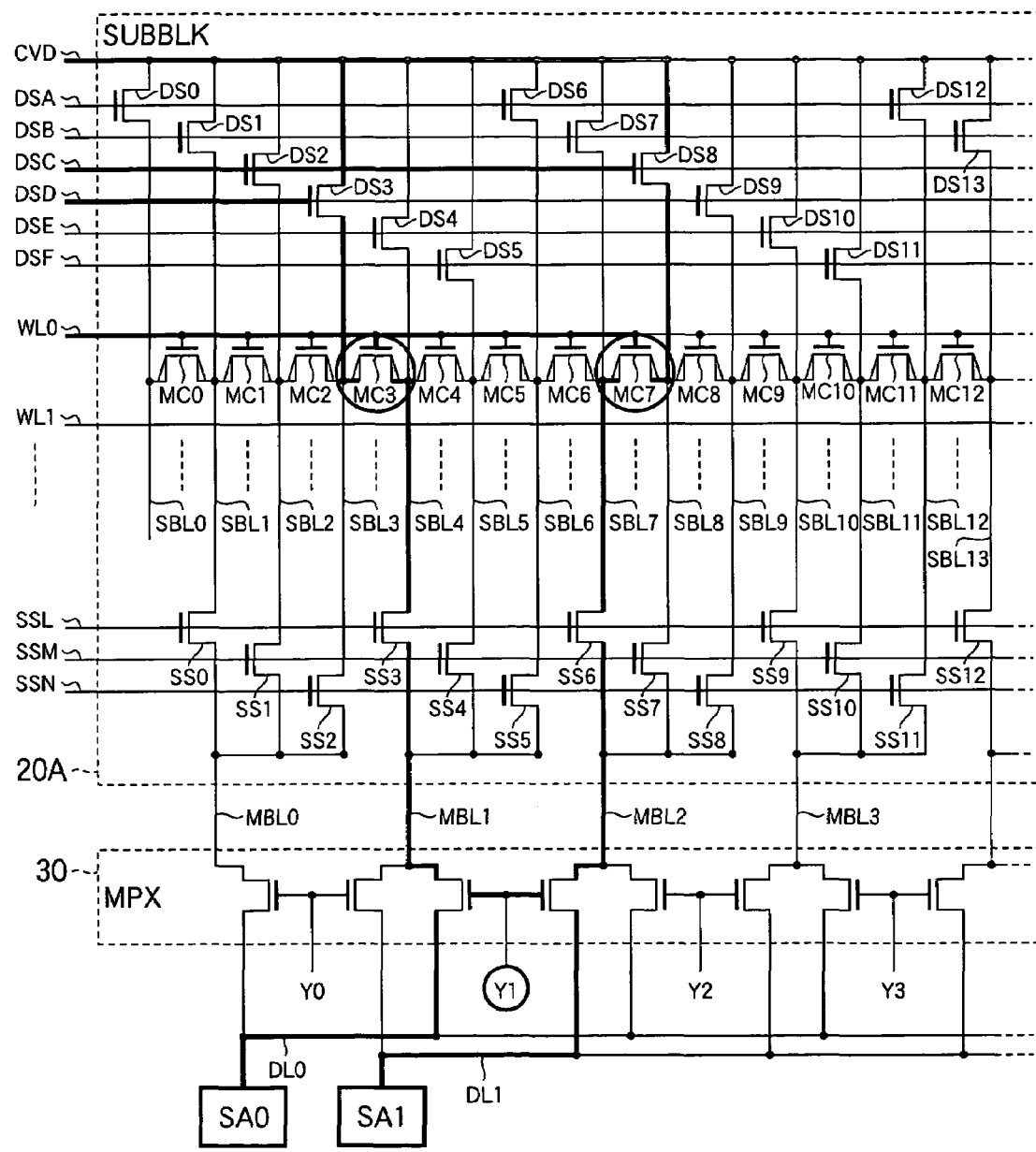
FIG. 10 shows the structure of a memory array circuit illustrating a second embodiment of the invention.

Referring to FIG. 10, the memory array in the second embodiment comprises a plurality of subblocks 20A and a multiplexer 30 substantially identical to the multiplexer in the first embodiment. The illustrated subblock 20A comprises a plurality of mutually parallel word lines WLi (i=0, 1, . . . ) and a plurality of mutually parallel sub-bit lines SBLj (j=0, 1, . . . ) that cross the word lines WLi. Memory cells MCj similar to the one shown in FIG. 3 are located at the intersections of the word lines WLi and sub-bit lines SBLj. Each memory cell MCj has a gate electrode connected to the adjacent word line WLi and first and second main electrodes connected to respective sub-bit lines SBLj, SBLj+1. The sub-bit lines SBLj are connected at one end through drain selectors DSj to the common power supply line CDV.

In contrast to the memory array circuit in FIG. 7, in FIG. 9 drain selectors DS(6j) (j=0, 1, 2, . . . ) have their gates connected to the first drain select line DSA. Similarly, drain selectors DS(6j+1), DS(6j+2), DS(6j+3). DS(6j+4), and DS(6j+5) (j=0, 1, 2, . . . ) have their gates connected to second to sixth drain select lines DSB, DSC, DSD, DSE, and DSF, respectively.

The other ends of the sub-bit lines SBLj are connected in triplets through source selectors SSj to the main bit lines. Specifically, the three mutually adjacent sub-bit lines SBL3k+1, SBL3k+2, SBL3k+3 are connected through respective source selectors SS3k, SS3k+1, SS3k+2 to main bit line MBLk (k=0, 1, 2, . . . ). The gates of source selectors SS3k, SS3k+1, and SS3k+2 are connected to source select lines SSL, SSM, and SSN, respectively.

A plurality of subblocks similar to the illustrated subblock 20A are connected in parallel to the main bit lines MBL0, MBL1, . . . , which are connected through the multiplexer 30 to data lines DL0, DL1. Sense amplifiers SA0, SA1, a data write circuit (not shown), and other circuits (not shown) are connected to the data lines DL0, DL1 as in FIG. 7.

The thick lines in FIG. 10 indicate the current paths activated when memory cells MC3 and MC7 are selected by selecting drain select lines DSC and DSD, word line WL0, source select line SSL, and select signal Y1 in the multiplexer 30. It can be seen that off-path parasitic capacitance is restricted mainly to the three intermediate memory cells (MC4 to MC6) and two intermediate sub-bit lines (SBL5, SBL6) which, together with the selected sub-bit lines SBL4, SBL7, are disposed between the two selected memory cells MC3, MC7.

In this example, for memory cell MC7, sub-bit line SBL8 operates as a drain line and sub-bit line SBL7 operates as a source line, so current flows through memory cell MC7 from right to left in the drawing. To allow current to flow through memory cell MC7 in the opposite direction, drain select lines DSA and DSB, word line WL0, source select line SSM, and select signal Y2 in the multiplexer 30 are selected, selecting memory cells MC7 and MC11. Sub-bit line SBL7 then operates as a drain line and sub-bit line SBL8 operates as a source line for memory cell MC7, so current flows through memory cell MC7 from left to right in the drawing. Once again, the selected sub-bit lines SBL8, SBL11, which function as current paths, are disposed in between the selected pair of memory cells (MC7, MC11), which are separated by three intermediate memory cells (MC8 to MC10).

As in the first embodiment, the memory array circuit 20A in the second embodiment is configured with drain selectors and source selectors at opposite ends of the sub-bit lines SBLj so that the connections to the common power supply line CDV and the main bit lines can be changed. The first and second main electrodes of each memory cell can be used as source and drain electrodes, respectively, or as drain and source electrodes, respectively, so the memory array circuit can be used with nonvolatile two-bit memory cells.

The second embodiment also has the advantage that, since the sub-bit lines selected for reading data are disposed between the selected pair of memory cells, parasitic capacitance due to circuit elements off the read paths is reduced, enabling high-speed operation. When compared with the memory array circuit in FIG. 7, the number of sub-bit lines intermediate between the selected sub-bit lines is increased from one to two, so that the parasitic capacitance increases slightly. The leakage current flowing between the selected sub-bit lines, however, is reduced because the number of intermediate memory cells is increased from two to three.

Third Embodiment

Figure 11:
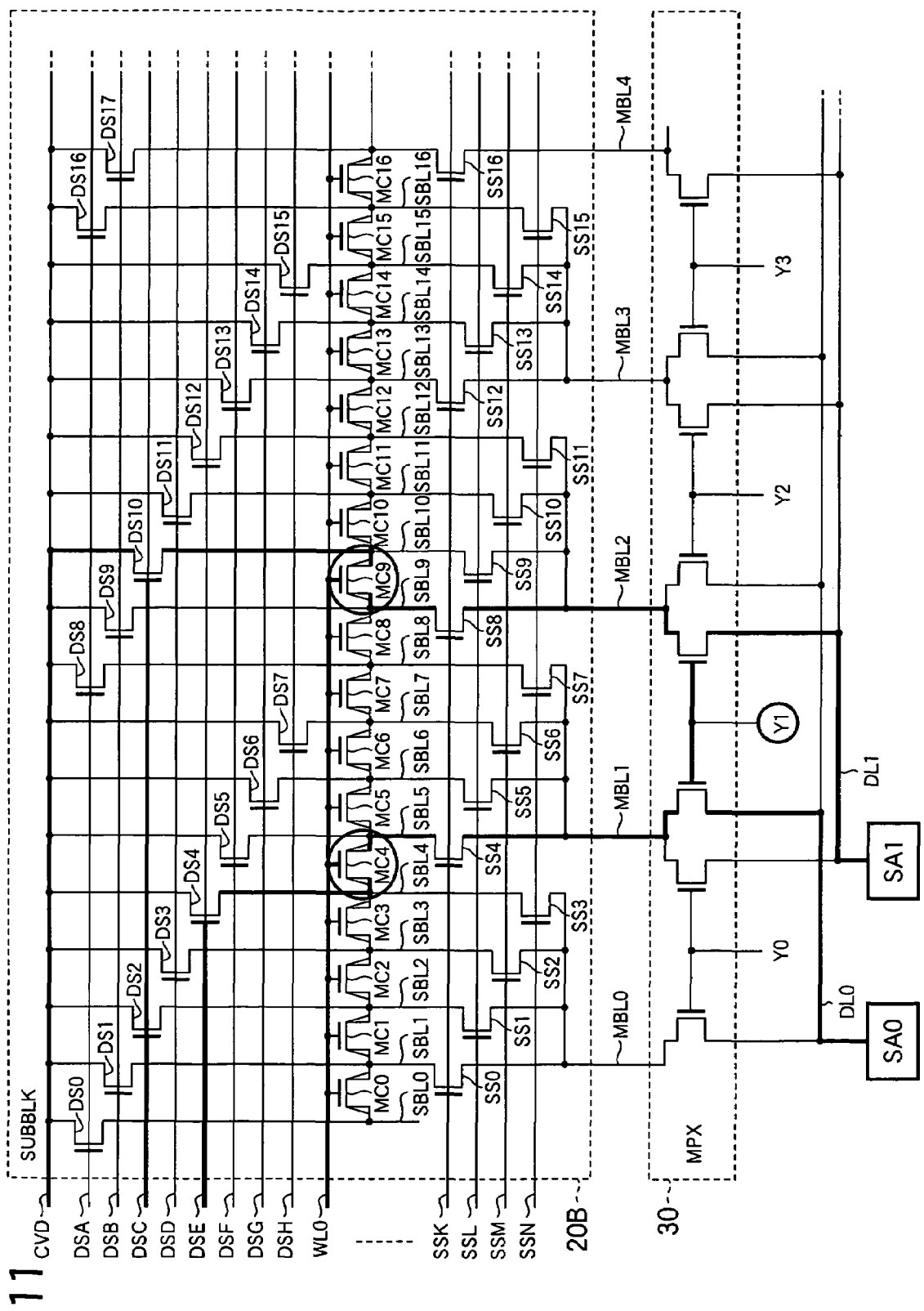
FIG. 11 shows the structure of a memory array circuit illustrating a third embodiment of the invention.

Referring to FIG. 11, the memory array in the third embodiment comprises a plurality of subblocks 20B and a multiplexer 30 substantially identical to the multiplexer in the first embodiment. The illustrated subblock 20B comprises a plurality of mutually parallel word lines WLi (i=0, 1, . . . , but only WL0 is shown in FIG. 11) and a plurality of mutually parallel sub-bit lines SBLj (j=0, 1, . . . ) that cross the word lines WLi. Memory cells MCj similar to the one shown in FIG. 3 are located at the intersections of the word lines WLi and sub-bit lines SBLj. Each memory cell MCj has a gate electrode connected to the adjacent word line WLi and first and second main electrodes connected to respective sub-bit lines SBLj, SBLj+1. The sub-bit lines SBLj are connected at one end through drain selectors DSj to the common power supply line CDV.

In contrast to the memory array circuit in FIG. 7, drain selectors DS(8j) (j=0, 1, 2, . . . ) have their gates connected to the first drain select line DSA. Similarly, drain selectors DS(8j+1), DS(8j+2), DS(8j+3), DS(8j+4), DS(8j+5), DS(8j+6), and DS(8j+7) have their gates connected to the second through eighth drain select lines DSB, DSC, DSD, DSE, DSF, DSG, and DSH, respectively.

The other ends of the sub-bit lines are connected in groups of four through source selectors to the main bit lines. Specifically, the four mutually adjacent sub-bit lines SBL4k+1, SBL4k+2, SBL4k+3, SBL4k+4 are connected through respective source selectors SS4k, SS4k+1, SS4k+2, SS4k+3 to main bit line MBLk (k=0, 1, 2, . . . ). The gates of source selectors SS4k, SS4k+1, SS4k+2, SS4k+3 are connected to respective source select lines SSK, SSL, SSM, SSN.

A plurality of subblocks similar to the illustrated subblock 20B are connected in parallel to the main bit lines MBL0, MBL1, . . . , which are connected through the multiplexer 30 to data lines DL0, DL1. Sense amplifiers SA0, SA1, a data write circuit (not shown), and other circuits (not shown) are connected to the data lines DL0, DL1 as in FIG. 7.

The thick lines in FIG. 11 indicate the active current paths when memory cells MC4 and MC9 are selected by selecting drain select lines DSC and DSE, word line WL0, source select line SSK, and select signal Y1 in the multiplexer 30. It can be seen that the selected sub-bit lines SBL5, SBL9 that become part of the current paths are located between the two selected memory cells MC4, MC9, together with four intermediate memory cells (MC5 to MC8).

In access to memory cell MC9, sub-bit lines SBL9 and SBL10 operate as a source line and a drain line, respectively, so current flows through memory cell MC9 from right to left in the drawing. To allow current to flow through memory cell MC9 in the opposite direction, drain select lines DSB and DSH, word line WL0, source select line SSL, and select signal Y2 in the multiplexer 30 are selected, selecting memory cells MC9 and MC14. In this case, sub-bit lines SBL8 and SBL9 operate as drain and source lines, respectively, for memory cell MC9, so current flows through memory cell MC9 from left to right in the drawing.

The memory array circuit in the third embodiment, like those in the first and second embodiments, can be used with nonvolatile two-bit memory cells, and has the advantage of reduced parasitic capacitance due to circuit elements off the read paths, thereby enabling high-speed operation. Compared with the memory array circuit in FIG. 10, the number of intermediate sub-bit lines disposed between the selected sub-bit lines is increased from two to three, so the parasitic capacitance is increased slightly. The leakage current flowing between the selected pair of sub-bit lines, however, is reduced because the number of intermediate memory cells is increased from three to four.

The invention is not limited to the above embodiments; various modifications are possible. Examples of such modifications include the following.

(1) The number of intermediate memory cells disposed between the two selected cells has been described as two, three, or four, but there can be any number of intermediate memory cells.

In the general case, when there are m intermediate memory cells and 2n main bit lines, 2mn+1 sub-bit lines are provided and each main bit line is connected to a different set of m mutually adjacent sub-bit lines. A drain selector controlled by a drain select signal is provided between one end of each of the sub-bit lines and a common power supply, and a source selector controlled by a source select signal is provided between the other end of each of the sub-bit lines and the corresponding main bit line.

There are 2m drain select signal lines. The 2m drain selectors numbered 2mi, 2mi+1, . . . , 2m(i+1)−1 (where i is any integer from 0 to n−1) are controlled by the first, second, . . . , 2m-th drain select line, respectively. Similarly, there are m source select lines. The m source selectors numbered mj, mj+1, . . . , m(j+1)−1 (where j is any integer from 0 to 2n−1) are controlled by the first, second, . . . , m-th source select lines, respectively. The parameters m and n can be any pair of integers both greater than one.

(2) In the circuit structure described above, the common power supply line supplies a drain voltage to the memory cells and the source electrodes of the memory cells are grounded via the sense amplifiers. The circuit structure, however, can be modified so that the source electrodes of the memory cells are grounded to a common ground line and a drain voltage is supplied from the sense amplifiers to the memory cells.

Those skilled in the art will recognize that further variations are possible within the scope of the invention, which is defined in the appended claims.

What is claimed is:

1. A memory array circuit comprising:
   a common power supply line;
   a plurality of mutually parallel word lines;
   at least 2mn+1 mutually parallel sub-bit lines crossing the word lines, m and n being integers greater than one;
   at least 2n mutually parallel main bit lines;
   at least 2mn first switching elements switchably connecting each of the at least 2n main bit lines to a consecutive group of m of the sub-bit lines;
   at least 2mn+1 second switching elements switchably connecting each of the 2mn+1 sub-bit lines to the common power supply line;
   a plurality of memory cells, each memory cell having a pair of main electrodes connected to a mutually adjacent pair of the sub-bit lines and a control electrode connected to one of the word lines, each memory cell storing two bits of information readable from different ones of the main electrodes when the word line to which the control electrode is connected is activated;
   m first signal lines connected to and controlling different sets of the first switching elements, each set including one first switching element and all other first switching elements disposed at intervals equal to integer multiples of m sub-bit lines from that one second switching element; and
   2m second signal lines connected to and controlling different sets of the second switching elements, each set including one second switching element and all other second switching elements disposed at intervals equal to integer multiples of 2m sub-bit lines from that one second switching element.

2. The memory array circuit of claim 1, further comprising a multiplexer selecting a pair of mutually adjacent main bit lines to read one bit of data from each of a selectable pair of memory cells in the plurality of memory cells, operating in conjunction with signals on the first signal lines and the second signal lines so that the sub-bit lines connecting the selected pair of memory cells to the selected pair of mutually adjacent main bit lines are disposed between the sub-bit lines connecting the selected pair of memory cells to the common power supply line.

3. The memory array circuit of claim 2, further comprising a pair of sense amplifiers to which the multiplexer connects the selected pair of main bit lines, for amplifying the data read from the selected pair of memory cells.

4. The memory array circuit of claim 1, wherein the first and second switching elements are field-effect transistors.

5. The memory array circuit of claim 1, wherein the memory cells are readable and writable.

6. The memory array circuit of claim 5, wherein each memory cell has a pair of charge storage regions chargeable by hot carrier injection, disposed on opposite sides of the control electrode.

7. The memory array circuit of claim 1, wherein:
   the sub-bit lines are numbered consecutively from zero to at least 2mn;
   the first signal lines are numbered by a parameter s taking values from zero to m−1;

the first switching elements are numbered consecutively from zero to 2mn−1 in order of the sub-bit lines to which they are connected; and the first signal line numbered s is connected to the first switching elements numbered mi+s, i being an integer taking values from zero to at least 2n−1.

8. The memory array circuit of claim 1, wherein:

the sub-bit lines are numbered consecutively from zero to at least 2mn;

the second signal lines are numbered by a parameter d taking values from zero to 2m−1;

the second switching elements are numbered consecutively from zero to at least 2mn in order of the sub-bit lines to which they are connected; and the second signal line numbered d is connected to the second switching elements numbered 2mj+d, j being an integer taking values from zero to at least n−1, the second signal line numbered zero also being connected to the second switching element numbered 2mn.

9. A memory array circuit comprising:

a common power supply line;

a plurality of mutually parallel word lines;

at least 4n+1 consecutively numbered mutually parallel sub-bit lines crossing the word lines, n being an integer greater than one;

at least 2n mutually parallel main bit lines;

at least 2n even-numbered first switching elements switchably connecting each of the at least 2n main bit lines to an odd-numbered one of the at least 4n+1 sub-bit lines;

at least 2n odd-numbered first switching elements switchably connecting each of the at least 2n main bit lines to an even-numbered one of the at least 4n+1 sub-bit lines adjacent the connected odd-numbered one of the at least 4n+1 sub-bit lines;

at least 4n+1 consecutively numbered second switching elements switchably connecting each of the at least 4n+1 sub-bit lines to the common power supply line;

a plurality of memory cells, each memory cell having a pair of main electrodes connected to a mutually adjacent pair of the sub-bit lines and a control electrode connected to one of the word lines, each memory cell storing two bits of information readable from different ones of the main electrodes when the word line to which the control electrode is connected is activated;

a first signal line connected to and controlling the even-numbered first switching elements;

a second signal line connected to and controlling the odd-numbered first switching elements;

a third signal line connected to and controlling the second switching elements numbered with numbers giving remainders of zero when divided by four;

a fourth signal line connected to and controlling the second switching elements numbered with numbers giving remainders of one when divided by four;

a fifth signal line connected to and controlling the second switching elements numbered with numbers giving remainders of two when divided by four; and a sixth signal line connected to and controlling the second switching elements numbered with numbers giving remainders of three when divided by four.

10. The memory array circuit of claim 9, further comprising a multiplexer selecting a pair of mutually adjacent main bit lines to read one bit of data from each of a selectable pair of memory cells in the plurality of memory cells, operating in conjunction with signals on the first to sixth signal lines so that the sub-bit lines connecting the selected pair of memory cells to the selected pair of mutually adjacent main bit lines are disposed between the sub-bit lines connecting the selected pair of memory cells to the common power supply line.

11. The memory array circuit of claim 10, further comprising a pair of sense amplifiers to which the multiplexer connects the selected pair of main bit lines, for amplifying the data read from the selected pair of memory cells.

12. The memory array circuit of claim 9, wherein the first and second switching elements are field-effect transistors.

13. The memory array circuit of claim 9, wherein the memory cells are readable and writable.

14. The memory array circuit of claim 13, wherein each memory cell has a pair of charge storage regions chargeable by hot carrier injection, disposed on opposite sides of the control electrode.

* * * * *